(12) United States Patent
Hsu et al.

(10) Patent No.: US 9,659,948 B2
(45) Date of Patent: May 23, 2017

(54) SEMICONDUCTOR DEVICE AND METHOD OF FABRICATING SEMICONDUCTOR DEVICE

(71) Applicant: UNITED MICROELECTRONICS CORP., Hsin-Chu (TW)

(72) Inventors: Chia-Ching Hsu, Yunlin County (TW); Ko-Chi Chen, Taoyuan (TW); Shen-De Wang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/856,577

(22) Filed: Sep. 17, 2015

(65) Prior Publication Data

US 2017/0084622 A1    Mar. 23, 2017

(51) Int. Cl.
*H01L 27/11529* (2017.01)
*H01L 27/11573* (2017.01)
*H01L 27/11531* (2017.01)

(52) U.S. Cl.
CPC .. *H01L 27/11529* (2013.01); *H01L 27/11531* (2013.01); *H01L 27/11573* (2013.01)

(58) Field of Classification Search
CPC ................................................. H01L 27/11531
See application file for complete search history.

(56) References Cited

U.S. PATENT DOCUMENTS

| | | | |
|---|---|---|---|
| 6,424,016 B1 * | 7/2002 | Houston | H01L 27/10894 257/296 |
| 8,518,775 B2 | 8/2013 | Liu | |
| 2013/0082318 A1 * | 4/2013 | Liu | H01L 27/11546 257/324 |
| 2014/0175531 A1 * | 6/2014 | Huang | H01L 21/28282 257/324 |
| 2016/0064507 A1 * | 3/2016 | Arno | H01L 29/4975 257/314 |

OTHER PUBLICATIONS

Yu, Kun-Huang et al., Title: Semiconductor Device and Method of Forming the Same, pending U.S. Appl. No. 14/863,177, filed Sep. 23, 2015.

* cited by examiner

*Primary Examiner* — Peniel M Gumedzoe
*Assistant Examiner* — Christopher Johnson
(74) *Attorney, Agent, or Firm* — Winston Hsu; Scott Margo

(57) ABSTRACT

A semiconductor device includes a substrate with a memory region and a logic region, a logic gate stack, and a non-volatile gate stack. The substrate has a recess disposed in the memory region. The logic gate stack is disposed in the logic region and has a first top surface. The non-volatile gate stack is disposed in the recess and has a second top surface. The second top surface is lower than the first top surface by a step height.

11 Claims, 15 Drawing Sheets

US 9,659,948 B2

SEMICONDUCTOR DEVICE AND METHOD OF FABRICATING SEMICONDUCTOR DEVICE

BACKGROUND OF THE INVENTION

1. Field of the Invention

The present invention relates to a semiconductor device and a method of fabricating semiconductor device, more particularly, to a semiconductor device with non-volatile memory and logic transistor and fabricating method thereof.

2. Description of the Prior Art

A typical NVM integration circuit generally has structure including a non-volatile gate stack along with logic gate stacks. Recently, high dielectric constant metal gate (HKMG) scheme has been developed for the logic gate stacks. In a conventional replacement metal gate process of HKMG scheme, at least two chemical mechanical polishing (CMP) steps are utilized, wherein the first CMP step is performed prior to removing dummy polysilicon gate stacks and the second CMP step is performed after the deposition of the metal gate stacks is complete. These two CMP steps require that the upper surfaces of the gate stacks be coplanar. However, in consideration of applying HKMG scheme to the NVM integration circuit, the gate stack of the usual NVM cell is taller than the logic gate stacks, thus the formation of NVM cell is incompatible with the HKMG scheme.

SUMMARY OF THE INVENTION

It is one of the objectives of the present invention to provide a semiconductor device and fabricating method thereof that both the control gate and the logic transistor are not impacted through the formation processes of the NVM cell and the logic transistor respectively, such that the fabrication of the NVM cell and HKMG logic gate stack are compatible.

According to the embodiment of the present invention, a semiconductor device is provided. The semiconductor device includes a substrate with a memory region and a logic region, a logic gate stack, and a non-volatile gate stack. The substrate has a recess disposed in the memory region. The logic gate stack is disposed in the logic region and has a first top surface. The non-volatile gate stack is disposed in the recess and has a second top surface. The second top surface is lower than the first top surface by a step height.

According to the embodiment of the present invention, a method of fabricating a semiconductor device is further provided. The method includes providing a substrate with a memory region and a logic region, forming a recess of the substrate in the memory region, forming a non-volatile gate stack in the recess, and forming a logic gate stack in the logic region after forming the non-volatile gate stack.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams illustrating manufacturing process according to a first embodiment of the method for fabricating semiconductor device of the present invention, wherein FIG. 1 is a schematic drawing of a cross-sectional view of the semiconductor device mentioned in the first embodiment;

FIG. 2 is a schematic drawing in a step subsequent to FIG. 1;

FIG. 3 is a schematic drawing in a step subsequent to FIG. 2;

FIG. 4 is a schematic drawing in a step subsequent to FIG. 3;

FIG. 5 is a schematic drawing in a step subsequent to FIG. 4;

FIG. 6 is a schematic drawing in a step subsequent to FIG. 5;

FIG. 7 is a schematic drawing in a step subsequent to FIG. 6;

FIG. 8 is a schematic drawing in a step subsequent to FIG. 7; and

FIG. 9 is a schematic drawing in a step subsequent to FIG. 8.

FIG. 12 to FIG. 14 are schematic diagrams illustrating the manufacturing process according to a second embodiment of the method for fabricating semiconductor device of the present invention, wherein:

FIG. 12 is a schematic drawing of a cross-sectional view of the semiconductor device mentioned in the second embodiment;

FIG. 13 is a schematic drawing in a step subsequent to FIG. 12; and

FIG. 14 is a schematic drawing in a step subsequent to FIG. 13.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
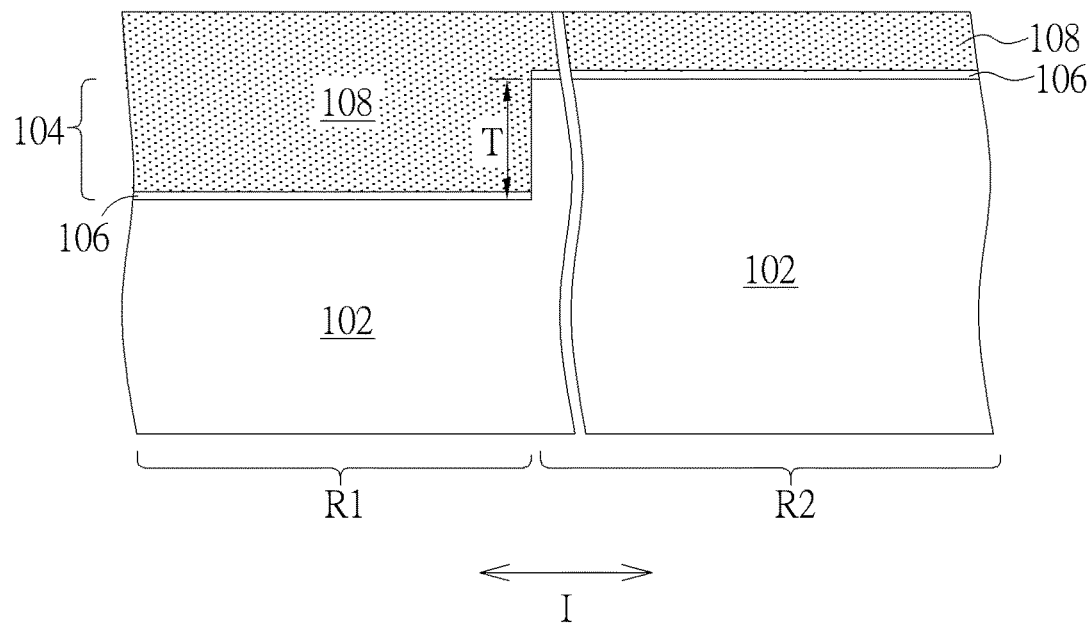

Please refer to FIG. 1 to FIG. 9, FIG. 1 to FIG. 9 are schematic diagrams illustrating manufacturing process according to a first embodiment of the method for fabricating semiconductor device of the present invention. FIG. 1 to FIG. 9 represent the cross-section view of the structure profile along a first sectional direction I, and FIG. 6 to FIG. 9 further represent the cross-section view of the structure profile along a second sectional direction II, wherein the first sectional direction I is perpendicular to the second sectional direction II. As shown in FIG. 1, a substrate 102 is first provided. A memory region R1 and a logic region R2 are defined on the substrate, wherein at least one NVM cell and at least one logic transistor are predetermined to be formed in the memory region R1 and the logic region R2 respectively. The substrate 102 may be a semiconductor substrate (such as a silicon substrate), a silicon containing substrate (such as a silicon carbide substrate), an III-V group-on-silicon (such as GaN-on-silicon) substrate, a graphene-on-silicon substrate, a silicon-on-insulator (SOI) substrate or an epitaxial layer containing substrate, but not limited thereto. Then, a recess 104 is formed by performing an etching process to the memory region R1. The formation of the recess 104 may include depositing an etching mask layer (not shown) on the substrate 102, patterning the etching mask layer to remove a portion of the etching mask layer disposed in the memory region R1, performing an etching process to remove a portion of the substrate 102 exposed by the patterned etching mask layer, and removing the patterned etching mask layer. The recess 104 has a depth T of about 500 to about 2500 angstroms, but not limited thereto. Then, a tunnel layer 106 is formed on the top surface of the substrate 102 and the bottom surface of the recess 104. For example, the tunnel layer 106 is an oxide layer and may be formed through a thermal process, but not limited thereto. Sequentially, a first polysilicon layer 108 is blanketly deposited on the substrate 102, covering the top surface of the substrate 102 and filling the recess 104. The first polysilicon layer 108 may have a thickness ranges from about 500 to about 2500 angstroms, but not limited thereto.

Figure 2:
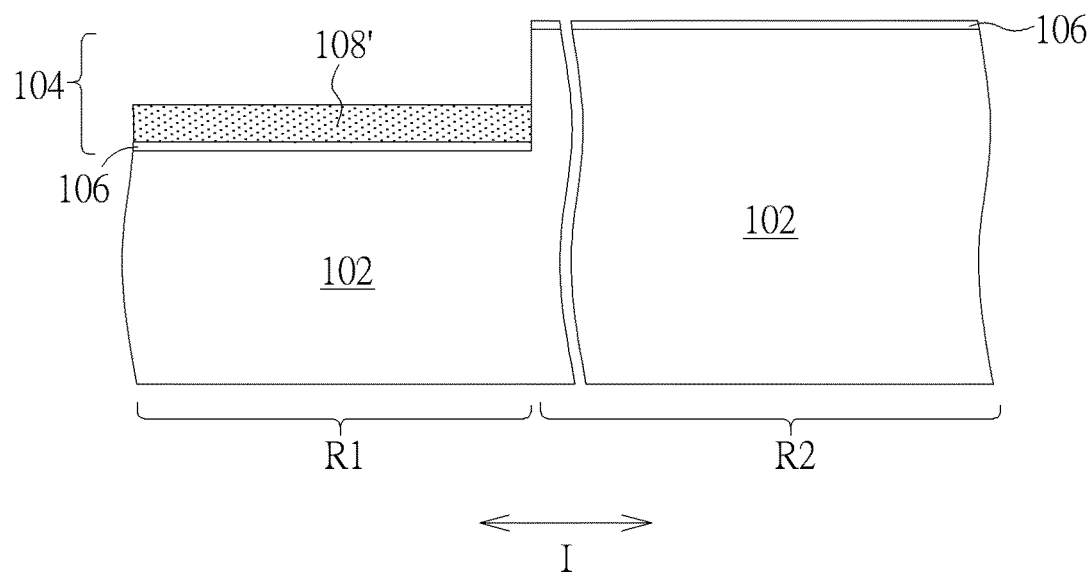

Referring to FIG. 2, a portion of the first polysilicon layer 108 is then removed. As an example, a CMP process may be first carried out to remove the polysilicon material positioned above the top surface of the substrate 102 by taking the tunnel layer 106 as a CMP stop layer, and then an etching back process is further performed to remove the upper portion of the remained polysilicon material in the recess 104. Therefore, the top surface of the remaining first polysilicon layer 108' is lower than the top surface of the substrate 102.

Figure 3:
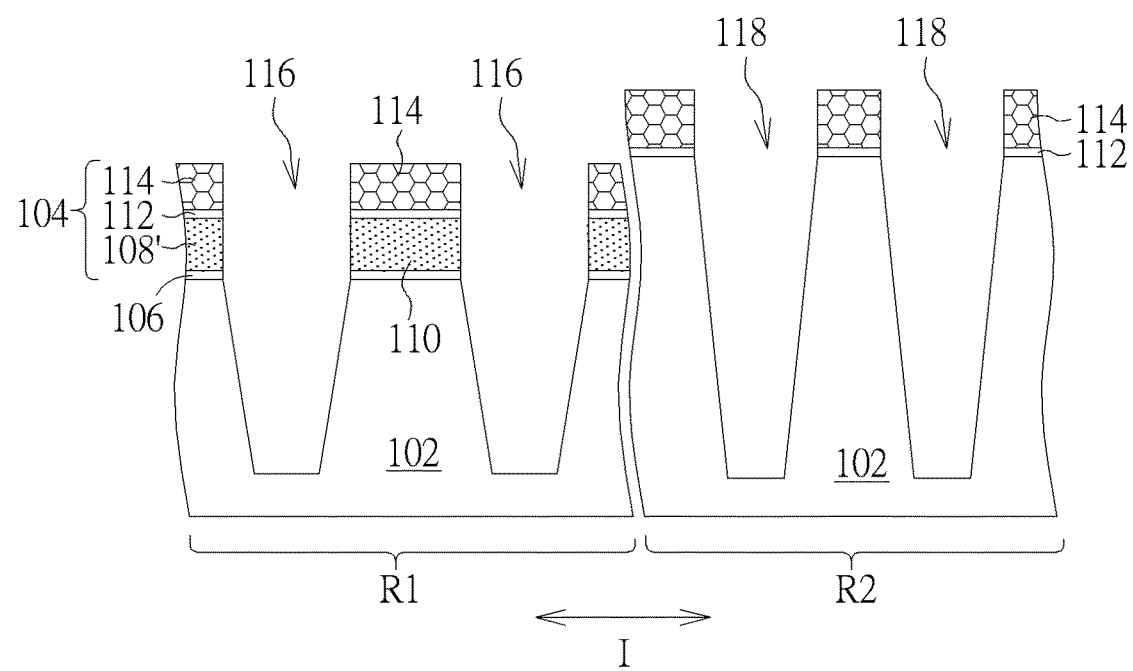

Referring to FIG. 3, a hard mask layer 114 is successfully formed on the substrate 102 and then patterned in order to define the pattern of shallow trench isolation (STI) structures. The hard mask layer 114 may include silicon nitride (SiN), and the liner 112 may be selectively formed before depositing the SiN layer, but not limited thereto. Thereafter, an etching process is performed to remove portions of the substrate 102 by taking the patterned hard mask layer 114 as an etching mask. According to the embodiment, at least two memory STI trenches 116 and at least two logic STI trenches 118 are respectively formed in the memory region R1 and the logic region R2. In this embodiment, two logic STI trenches 118 are illustrated for instance. During the etching process for defining the memory STI trenches 116 and the logic STI trenches 118, a portion of the first polysilicon layer 108' is also removed, and therefore the floating gate 110 is formed simultaneously. Therefore, the floating gate 110 is self-aligned when defining the pattern of the STI structures, and no extra photomask and etching process are needed for further removing the first polysilicon layer 108' in order to fabricate the floating gate 110. The floating gate 110 composed of the patterned polysilicon layer 108' is disposed between the two memory STI trenches 116.

Figure 4:
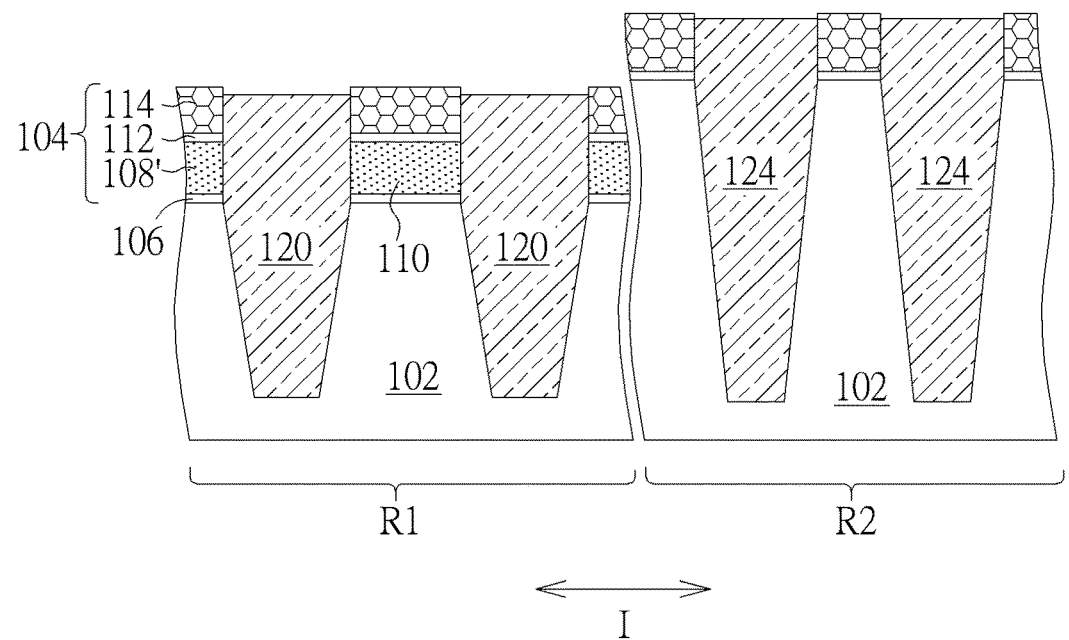

As shown in FIG. 4, an isolating layer, such as oxide layer, is following formed on the substrate 102 to fill the memory STI trenches 116 and the logic STI trenches 118. A CMP process is then carried out to remove the isolating layer by taking the hard mask layer 114 as a CMP stop layer. Thereafter, an etching back process may be selectively performed to remove the upper portion of the isolating layer that fills the memory STI trenches 116 and the logic STI trenches 118. Accordingly, two memory STI structures 120 and two logic STI structures 124 are respectively formed in the memory region R1 and the logic region R2. It is noteworthy that the floating gate 110 is disposed between the two adjacent memory STI structures 120.

Figure 5:
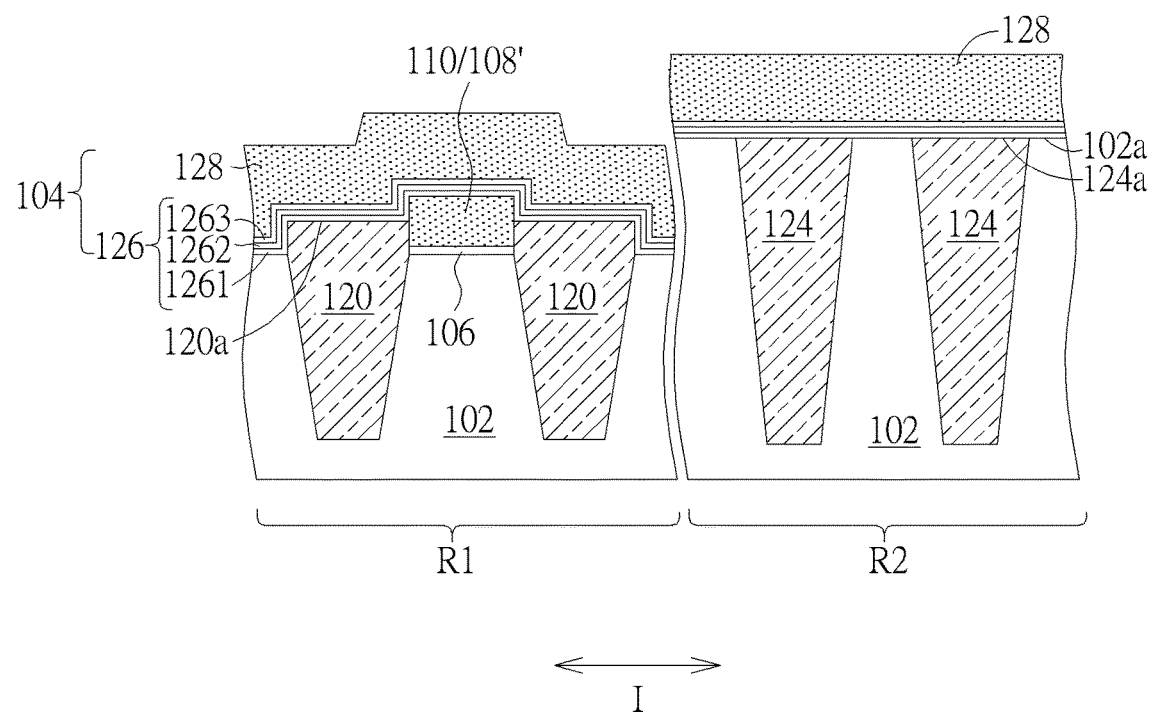

Referring to FIG. 5, the hard mask layer 114 is removed from the substrate 102. Sequentially, a STI leveling adjustment may be carried out to further lowering the top surface levels of the memory STI structures 120 and the logic STI structures 124. As a result, the top surface 120a of the memory STI structures 120 is lower than the top surface 102a of the substrate 102 and the top surface 124a of the logic STI structures 124. In this embodiment, the top surface 124a of the logic STI structures 124 and the top surface 102a of the substrate 102 are coplanar. Thereafter, a dielectric layer 126 and a second polysilicon layer 128 are successively deposited on the substrate 102 to cover the floating gate 110, the memory STI structures 120 and the logic STI structures 24 and fill the recess 104, wherein the dielectric layer 126 is preferably an stack layer including an oxide layer 1261, a nitride layer 1262, and an oxide layer 1263 from bottom to top, called as an oxide-nitride-oxide (ONO) stack-layer.

Figure 6:
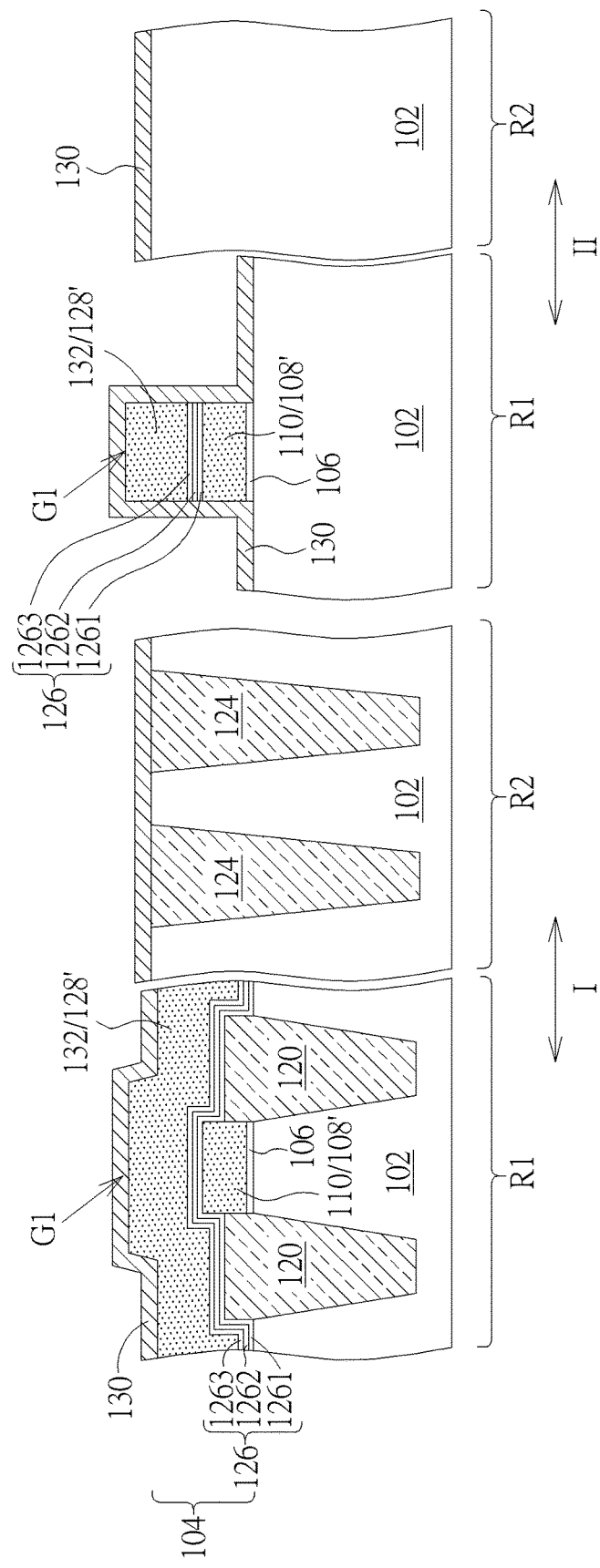

Please refer to FIG. 6. FIG. 6 illustrates the structure profiles along the first sectional direction I and the second sectional direction II at the same for reference, wherein the first sectional direction I is perpendicular to the second sectional direction II. An etching process is sequentially carried out to remove a portion of the second polysilicon layer 128 and a portion of the dielectric layer 126. The patterned second polysilicon layer 128' forms at least one control gate 132 covering the floating gate 110. During this etching process, both the second polysilicon layer 128 and the dielectric layer 126 in the logic region R2 are removed. Accordingly, the non-volatile gate stack G1 of NVM cell, including the control gate 132, the dielectric layer 126, and the floating gate 110, are fabricated in substance. Then, a buffer layer 130 is deposited on the substrate 102 blanketly to cover the patterned second polysilicon layer 128'. The buffer layer 130 may include oxide layer for instance. The buffer layer 130 provides protection effect to the control gate 132 for avoid damage from following fabrication process of the logic gate stack.

Figure 7:
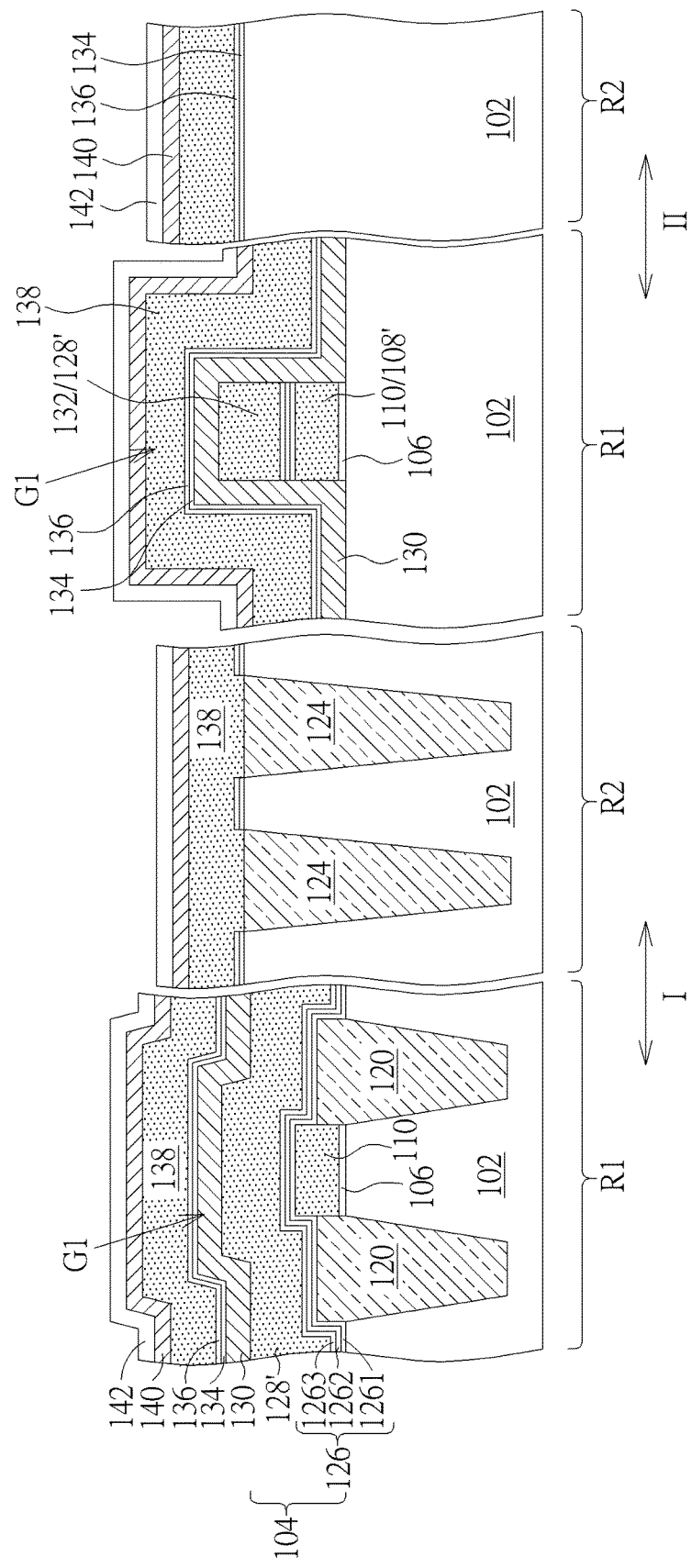

As shown in FIG. 7, a portion of the buffer layer 130 positioned in the logic region R2 is removed, which may be performed through an etching process. Then, a doping well (not shown) may be selectively formed by an ion implant process. Thereafter, a gate dielectric layer for the logic transistor is formed, which may include a high dielectric constant (HK) layer 134 when the predetermined logic transistor is a HKMG transistor to be formed. Furthermore, a barrier layer 136, such as TiN, may be formed on the HK layer 134 for the HK metal gate. However, the gate dielectric layer may include an interfacial layer and a HK layer for a MOS transistor in other embodiment, such as when the MOS transistor has polysilicon gate. A third polysilicon layer 138 is following deposited on the substrate 102 to cover the HK layer 134. The third polysilicon layer 138 is used for forming the polysilicon gate of the logic transistor. Sequentially, a mask layer is formed on the substrate 102, wherein the mask layer may include a bottom mask layer 140 and a top mask layer 142 for instance. For example, the bottom mask layer 140 is made of SiN, and the top mask layer 142 is made of oxide material, but not limited thereto.

Figure 8:
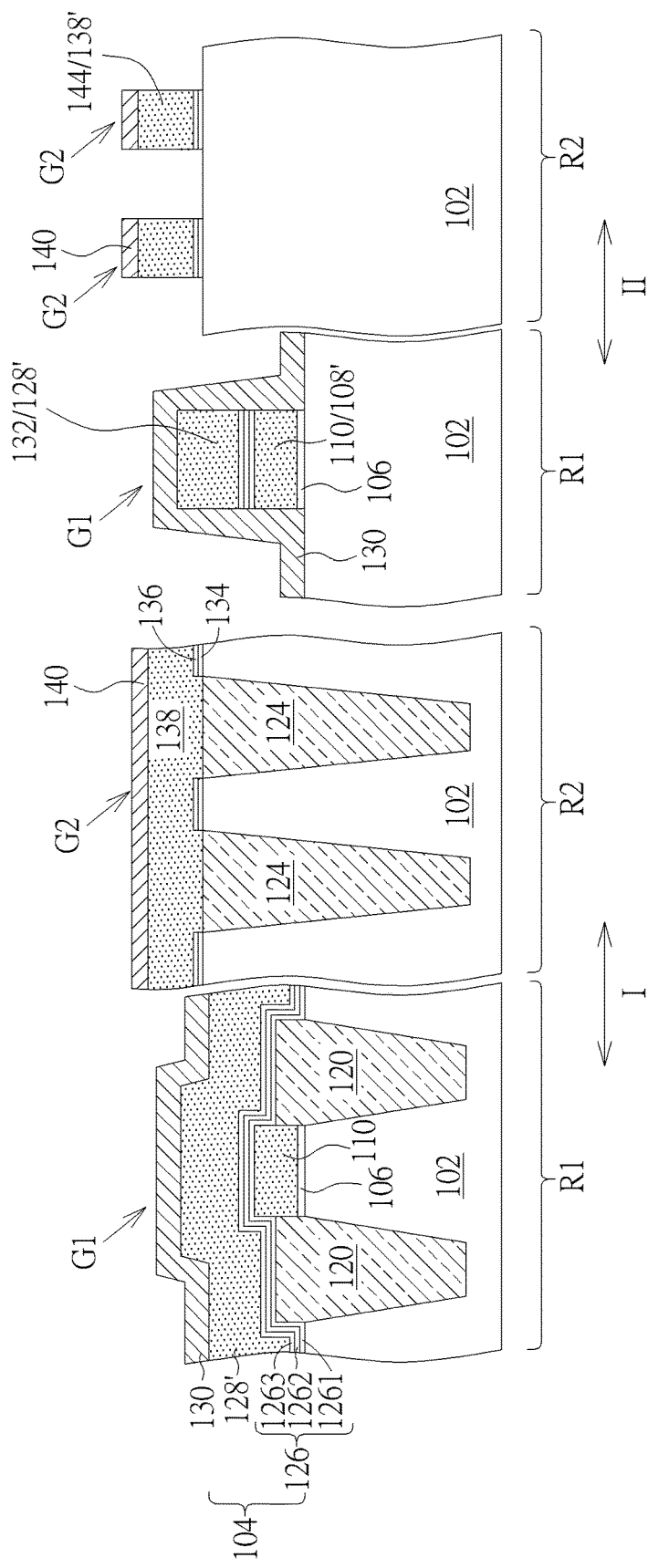

Please refer to FIG. 8, the above-mentioned mask layer is patterned, and an etching process is performed to pattern the third polysilicon layer 138 and define the pattern of the polysilicon gate of logic transistor by taking the patterned mask layer as an etching stop layer. This etching process removes the polysilicon layer 138 in the memory region R1 The patterned polysilicon layer 138' forms the polysilicon gate 144 in the logic region R2. In this etching process, the top mask layer 142 is removed, and a portion of the buffer layer 130 is removed, too, such that the surface of the buffer layer 130 covering the sidewall of the non-volatile gate stack of NVM cell is not perpendicular to the surface of the substrate 102. As shown in FIG. 8, the logic gate stacks G2 are formed in the logic region R2, wherein the remained bottom mask layer 140 may serve as a cap layer of the logic gate stacks G2.

Figure 9:
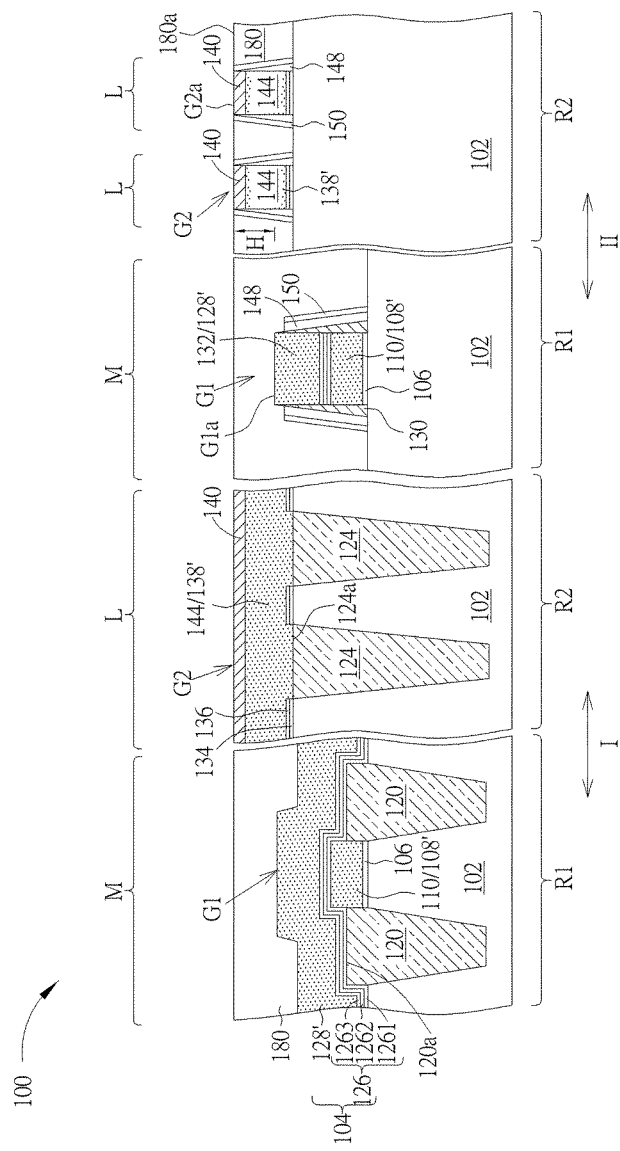

Referring to FIG. 9, the first spacer 148 is then formed to cover the sidewalls of the non-volatile gate stack G1 and the logic gate stack G2. An ion implant process may be carried out to form light diffusion drain (LDD) areas (not shown) in the substrate 102, near the non-volatile gate stack G1 and the logic gate stacks G2. Following that, an epitaxial layer (not shown) including silicon-germanium (SiGe) for example may be selectively formed on the surface of the substrate 102. The second spacer 150 is selectively formed to cover the first spacer 148. An ion implant process is further performed to form sources/drains (not shown) in the substrate 102, near the non-volatile gate stack G1 and the logic gate stack G2. Therefore, the semiconductor device 100 is completed, which has a NVM cell M and at least one logic transistor L disposed in the memory region R1 and logic region R2 respectively. The logic gate stack G2 has a first top surface G2a, and the non-volatile gate stack G1 has a second top surface G1a. Since the NVM cell M is disposed in the recess 104, the second top surface G1a is lower than the first top surface G2a by a step height H. The step height H ranges from about 200 to about 800 angstroms, but not limited thereto. In addition, the logic transistor L may be a HKMG transistor, and the manufacturing process for forming the metal gate may be further performed. For example, the polysilicon gate 144 may be removed to form gate trenches, a metal layer may be formed to fill the gate trenches, and a CMP process is carried out to remove the metal layer. Another cap layer may be formed to cover the metal gate. After forming the NVM cell M and the logic transistors L, an ILD layer 180 is formed on the substrate 102, covering the non-volatile gate stack G1 and the logic gate stack G2. The ILD layer 180 has a third top surface 180a coplanar with the first top surface G2a and higher than the second top surface G1a by the above-mentioned step height H.

As shown in FIG. 9, the semiconductor device 100 according to the first embodiment of the present invention includes a substrate 102 with a memory region R1 and a logic region R2, a logic gate stack G2 disposed in the logic region R2, a non-volatile gate stack G1 disposed in a recess 104 within the memory region R1. The logic gate stack G2 has a first top surface G2a, while the non-volatile gate stack G1 has a second top surface G1a lower than the first top surface G2a by a step height H. Preferably, the step height H is about 200 to about 800 angstroms. In addition, the non-volatile gate stack G1 includes an oxide-nitride-oxide (ONO) stack-layer (the dielectric layer 126) positioned between an upper polysilicon layer (the patterned second polysilicon layer 128') and a lower polysilicon layer (the patterned first polysilicon layer 108'). The logic gate stack G2 is composed of a patterned third polysilicon layer 138', wherein top surface of the patterned third polysilicon layer 138' is higher than the top surface of the patterned second polysilicon layer 128'. It should be noted that semiconductor device 100 further includes a buffer layer 130 covering the sidewall of the non-volatile gate stack G1 in the memory region R1 but not disposed in the logic region R2.

Figure 10:
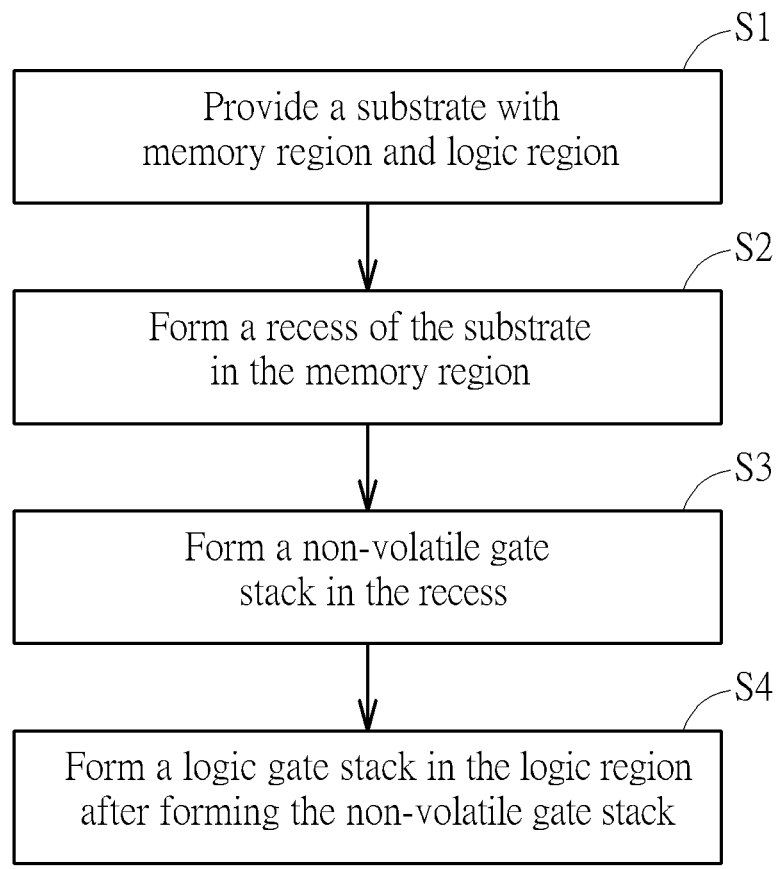
FIG. 10 is a schematic diagram illustrating the process flow of the method of fabricating a semiconductor device according to the present invention.

Please refer to FIG. 10. FIG. 10 is a schematic diagram illustrating the process flow of the method of fabricating a semiconductor device according to the present invention. From the above-description in the first embodiment, the method of fabricating the semiconductor device includes the following steps:

Step S1: Provide a substrate 102 with a memory region R1 and a logic region R2.

Step S2: Form a recess 104 of the substrate 102 in the memory region R1.

Step S3: Form a non-volatile gate stack G1 in the recess 104.

Step S4: Form a logic gate stack G2 in the logic region R2 after forming the non-volatile gate stack G1.

It should be noted that the method of fabricating the semiconductor device 100 may further includes a step of forming a buffer layer 130 to cover the non-volatile gate stack G1 before forming the logic gate stack G2 such that the buffer layer 130 can protect the non-volatile gate stack G1 during the formation of the logic gate stack G2.

Figure 11:
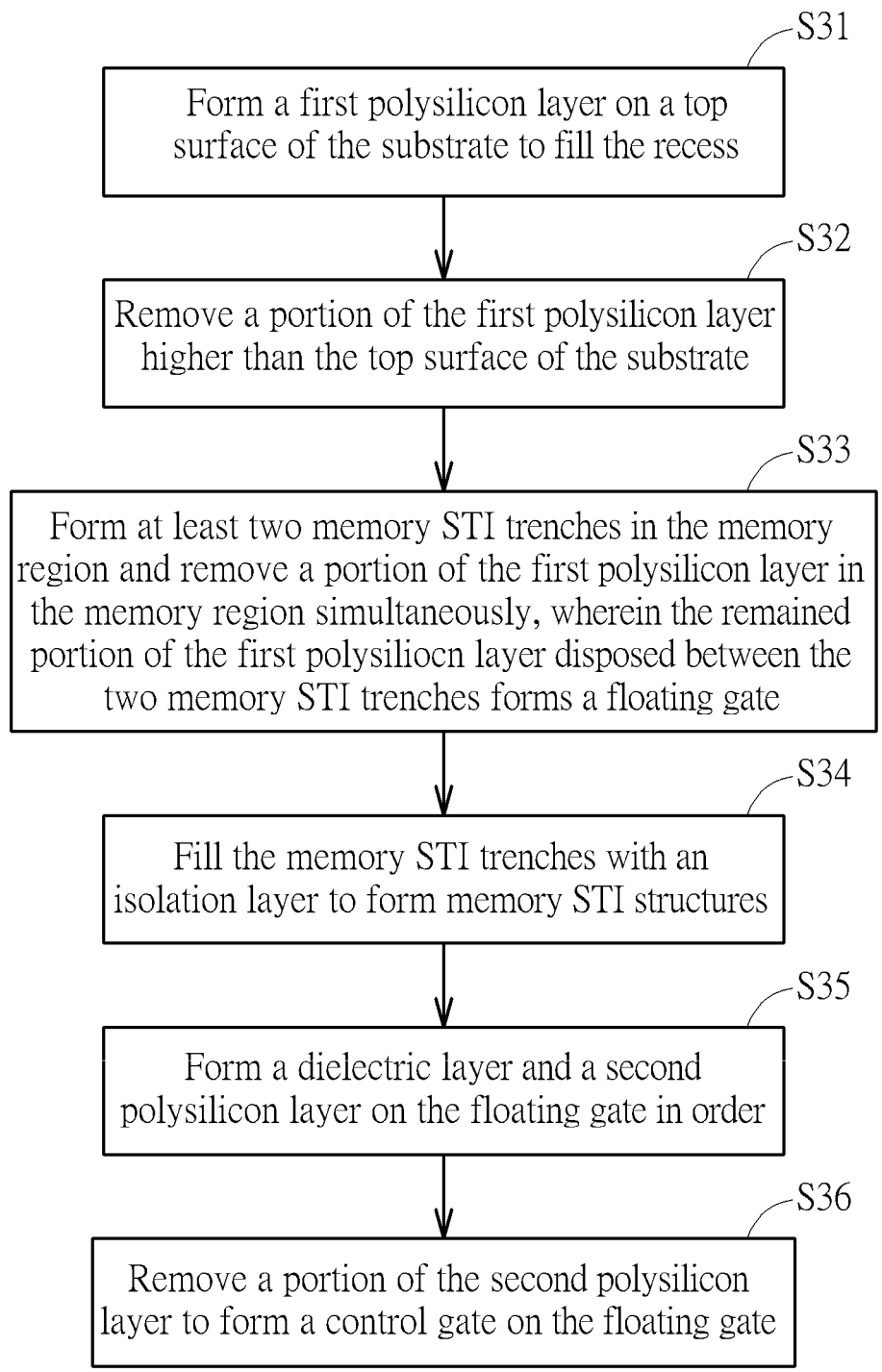
FIG. 11 illustrates the process flow of forming the non-volatile gate stack of the step S3 mentioned in FIG. 10 according to the first embodiment of the present invention.

Referring to FIG. 11, FIG. 11 illustrates the process flow of forming the non-volatile gate stack of the step S3 mentioned in FIG. 10 according to the first embodiment of the present invention. In this embodiment, the step of forming the non-volatile gate stack G1 further includes the following steps:

Step S31: Form a first polysilicon layer 108 on the top surface 102a of the substrate 102 to fill the recess 104.

Step S32: Remove a portion of the first polysilicon layer 108 positioned higher than the top surface 102a of the substrate 102.

Step S33: Format least two memory STI trenches 116 in the memory region R1 and remove a portion of the first polysilicon layer 108 in the memory region R1 simultaneously, wherein the remained portion of the first polysilicon layer 108' disposed between the two memory STI trenches 116 forms a floating gate 110.

Step S34: Fill the memory STI trenches 116 with an isolation layer to form memory STI structures 120. Furthermore, an etching back process to the memory STI structures 120 may be selectively performed such that the top surface 120a of the memory STI structures 120 is lower than the top surface 102a of the substrate 102.

Step S35: Form a dielectric layer 126 and a second polysilicon layer 128 on the floating gate 110 in order.

Step S36: Remove a portion of the second polysilicon layer 128 to form a control gate 132 on the floating gate 110.

The semiconductor device and fabrication method thereof are not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 12:
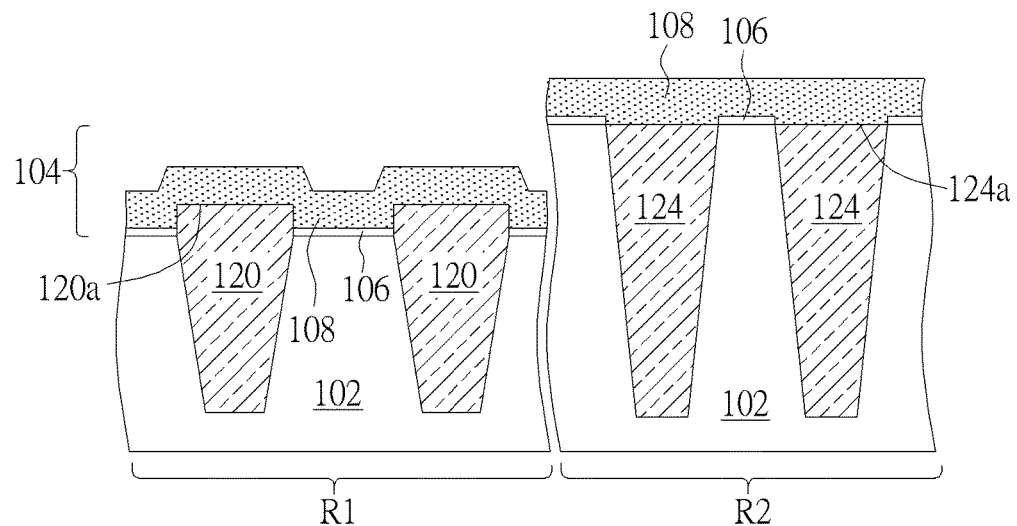
Figure 13:
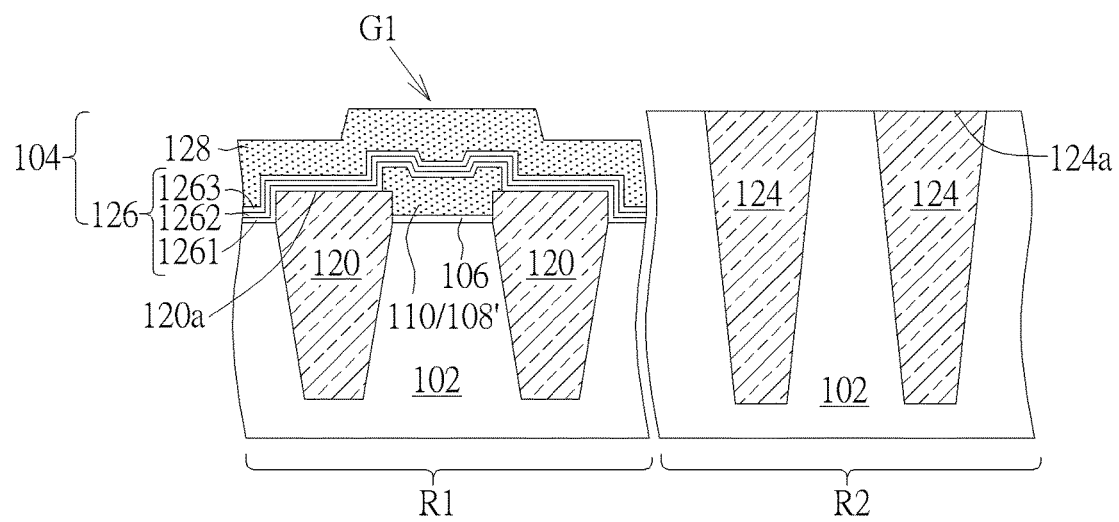
Figure 14:
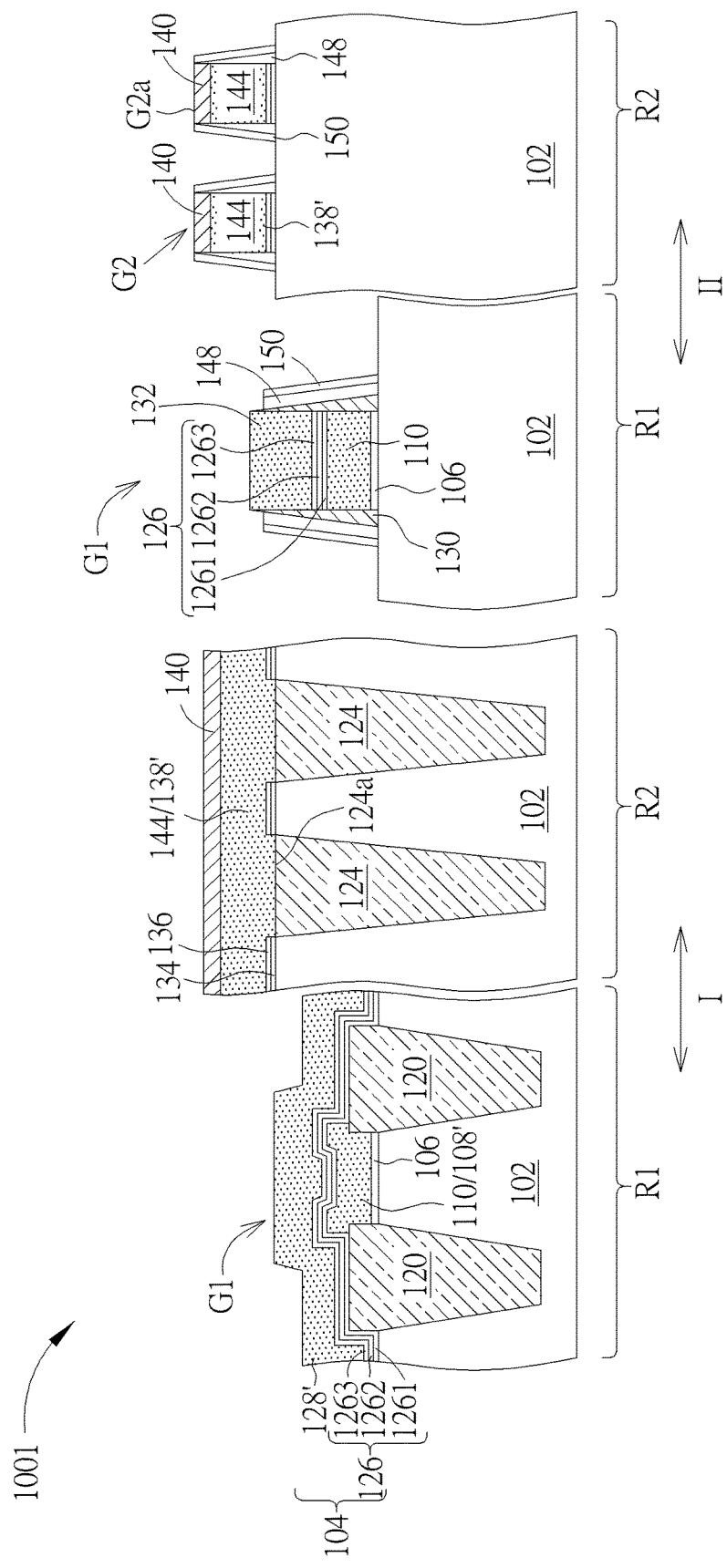

FIG. 12 to FIG. 14 are schematic diagrams illustrating the manufacturing process according to a second embodiment of the method for fabricating semiconductor device of the present invention. Referring to FIG. 12, a substrate 102 is first provided, and a recess 104 is formed in the memory region R1 on the substrate 102. Then, the STI trenches for forming STI structures are formed respectively in the memory region R1 and logic region R2, and an isolation layer is filled into the STI trenches to form the memory STI structures 120 and the logic STI structures 124. An etching back process may be selectively carried out to remove the upper portions of the memory STI structures 120 and the logic STI structures 124. In addition, a leveling adjustment process may be optionally performed to further lower the top surface of the memory STI structures 120. As shown in FIG. 12, the top surface 120a of the memory STI structures 120 is lower than the top surface 124a of the logic STI structures 124. After forming these STI structures, the tunnel layer 106 is formed on the surface of the substrate 102, and then the first polysilicon layer 108 is blanketly deposited on the substrate 102 to cover the memory STI structures 120, the logic STI structures 124, and the tunnel layer 106.

Referring to FIG. 13, an etching process is performed to pattern the first polysilicon layer 108 so as to define the pattern of the floating gate 110, and the portion of the first polysilicon layer 108 located in the logic region R2 is removed. The patterned first polysilicon layer 108' in the memory region R1 is positioned between two memory STI structures 120 and further partially overlaps the memory STI structures 120. Then, the dielectric layer 126, the ONO layer, and the second polysilicon layer 128 are successively formed on the substrate 102. An etching process is then performed to pattern the second polysilicon layer 128 and the dielectric layer 126 simultaneously, so as to form the non-volatile gate stack G1 and remove the second polysilicon layer 128 and the dielectric layer 126 in the logic region R2.

Referring to FIG. 14, a buffer layer 130 is then formed on the substrate 102 and is patterned to cover the non-volatile gate stack G1. Thereafter, the formation of the logic gate stack G2 is carried out as the following: forming the gate dielectric layer (the HK layer 134 and the barrier layer 136) on the substrate 102, forming the third polysilicon layer 138, patterning the gate dielectric layer and the polysilicon layer 138, forming the spacers 148, 150 and the sources/drains (not shown). Therefore, a semiconductor device 1001 of the second embodiment of the present invention is fabricated.

Figure 15:
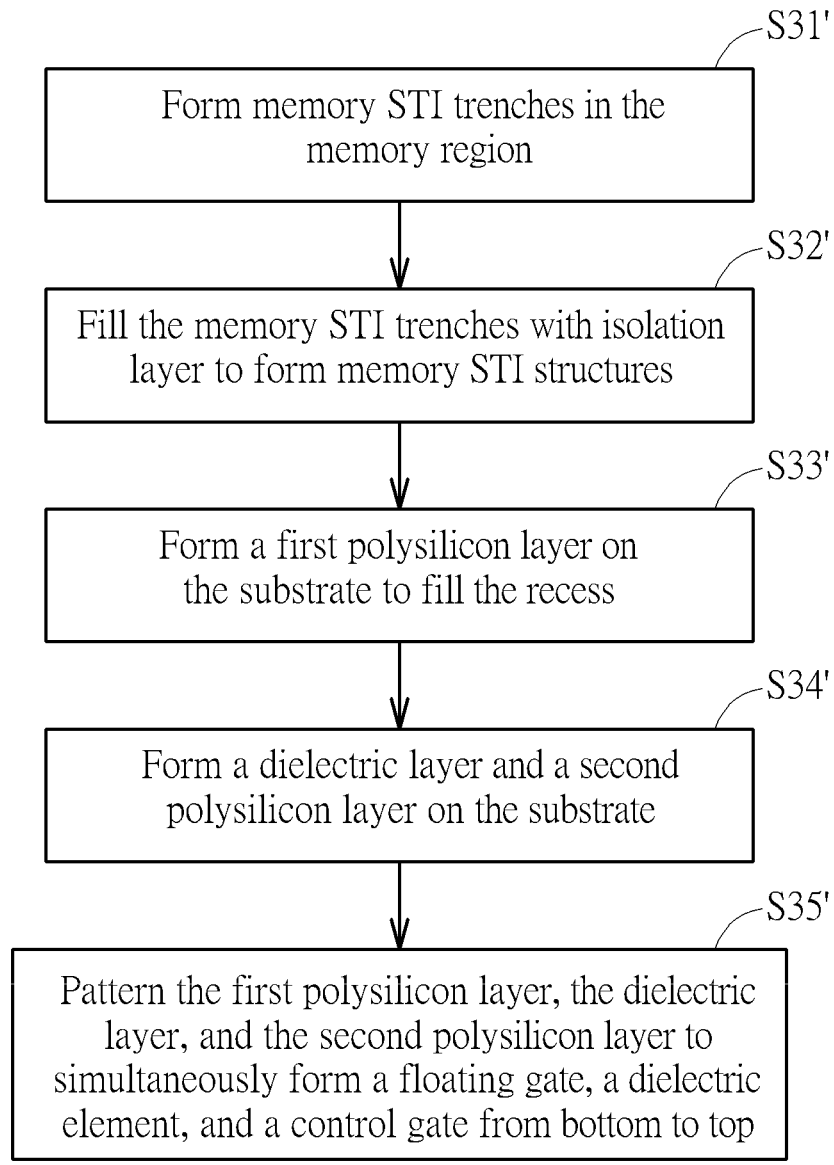
FIG. 15 illustrates the process flow of forming the non-volatile gate stack of the step S3 mentioned in FIG. 10 according to the second embodiment of the present invention.

Please refer to FIG. 15. FIG. 15 illustrates the process flow of forming the non-volatile gate stack of the step S3 mentioned in FIG. 10 according to the second embodiment of the present invention. In this embodiment, the step S3 shown in FIG. 10 of forming the non-volatile gate stack G1 includes the following steps:

Step S31': Form memory STI trenches in the memory region R1.

Step S32': Fill the memory STI trenches with an isolation layer to form memory STI structures 120.

Step S33': Forma first polysilicon layer 108 on the substrate 102 to fill the recess 104. An etching process may be performed to remove apart of the first polysilicon layer 108 in the memory region R1 but left another part of the first polysilicon layer 108 for forming the floating gate 110 in the memory region R1.

Step S34': Successively form a dielectric layer 126 and a second polysilicon layer 128 on the substrate 102 to fill the recess 104.

Step S35': Pattern the first polysilicon layer 108, the dielectric layer 126, and the second polysilicon layer 128 to simultaneously form a floating gate 110, a dielectric element, and a control gate 132 from bottom to top.

Figure 16:
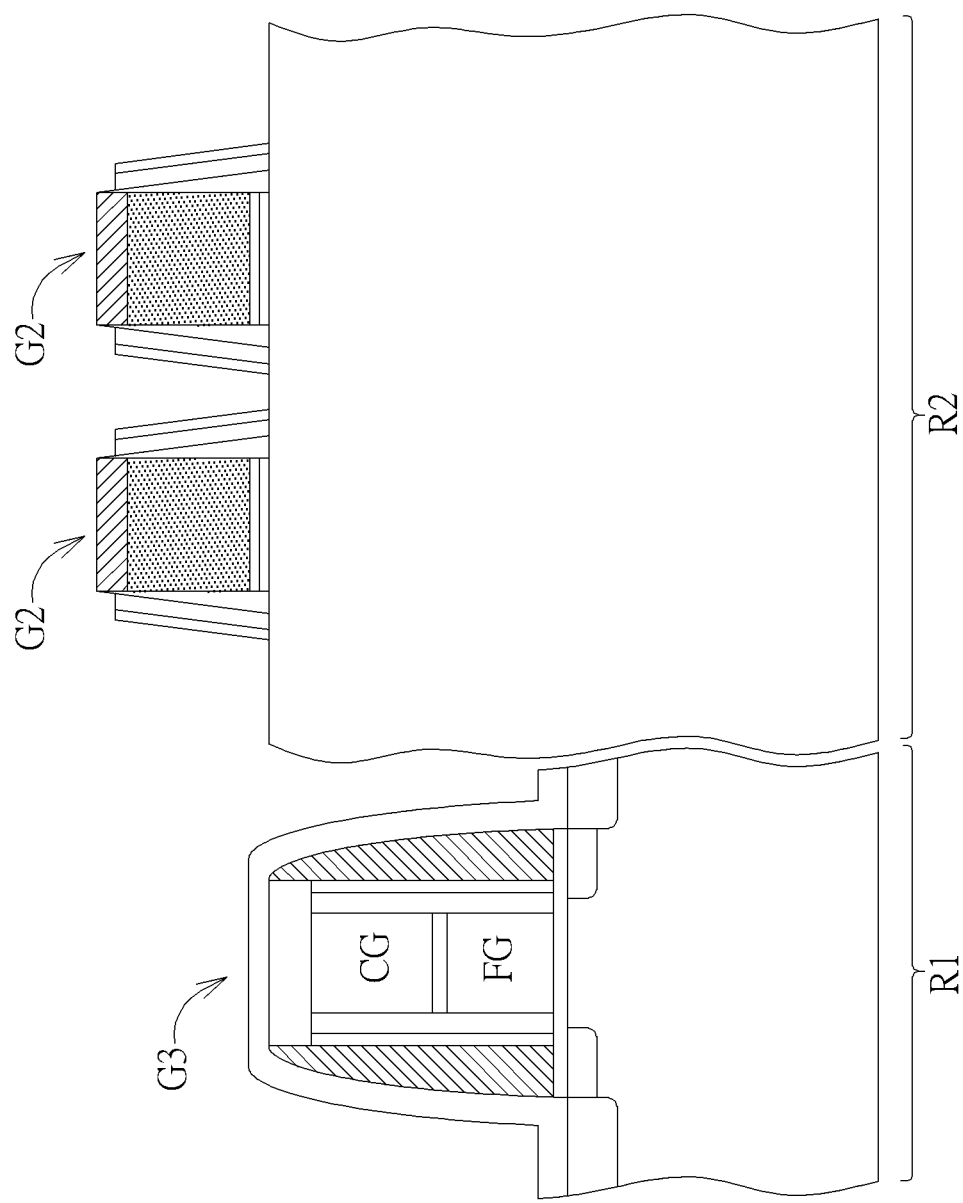
FIG. 16 is a schematic diagram of semiconductor device according to a third embodiment of the present invention.
Figure 17:
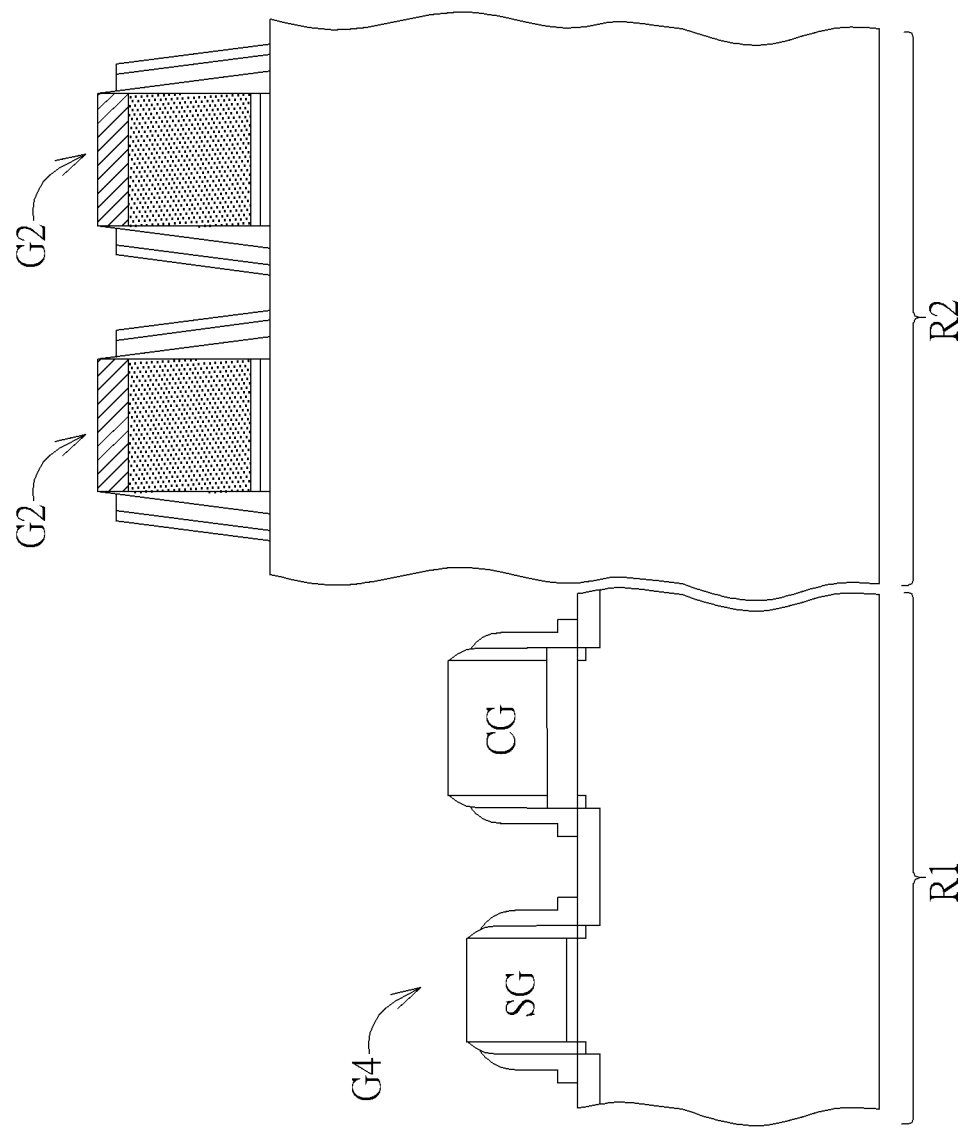
FIG. 17 is a schematic diagram of semiconductor device according to a fourth embodiment of the present invention.
Figure 18:
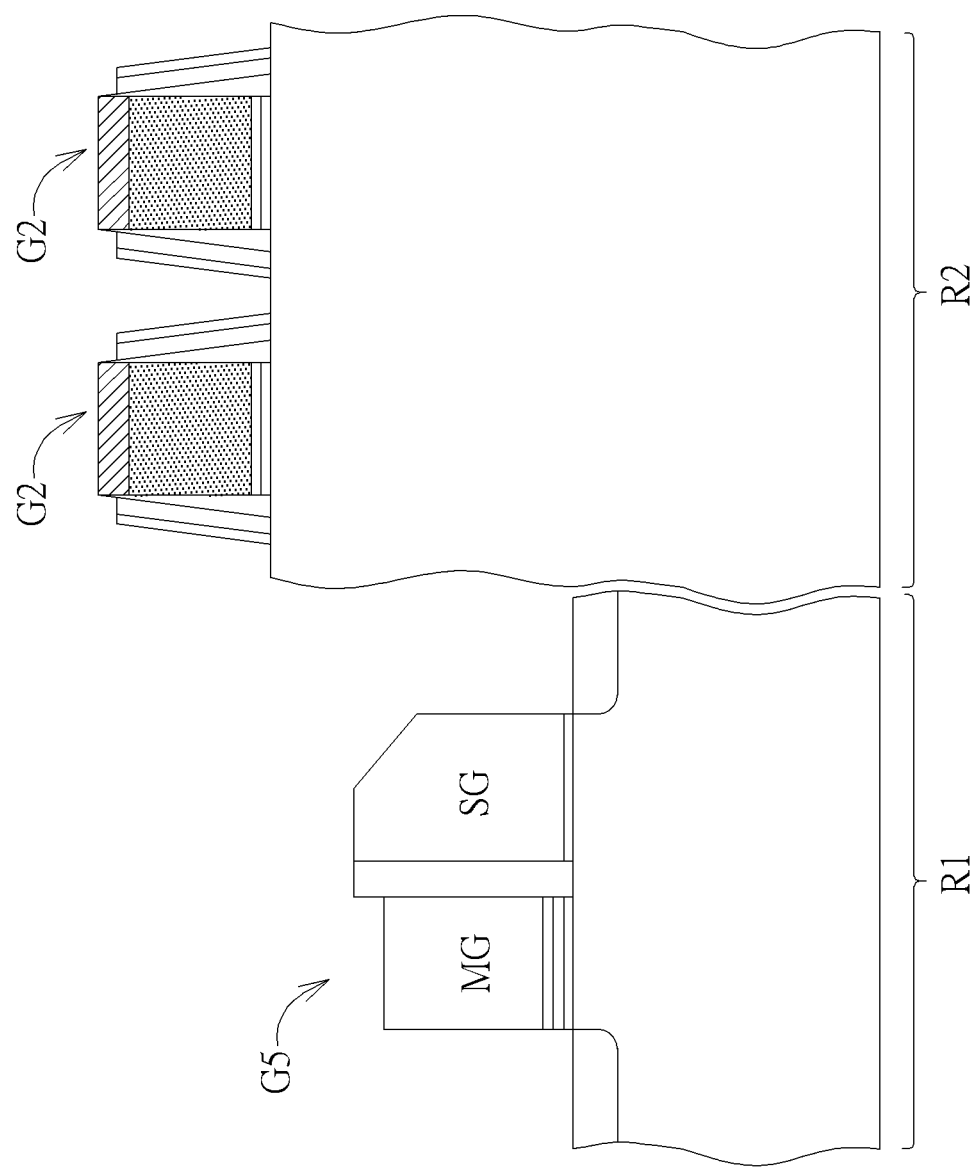
FIG. 18 is a schematic diagram of semiconductor device according to a fifth embodiment of the present invention.

Please refer to FIG. 16 to FIG. 18. FIG. 16 to FIG. 18 are schematic diagrams of semiconductor devices according to the third embodiment, the fourth embodiment, and the fifth embodiment of the present invention respectively. In the third embodiment shown in FIG. 16, the non-volatile gate stack G3 belongs to one-transistor electron tunnel oxide (1T ETOX) NVM cell. In the fourth embodiment shown in FIG. 17, the non-volatile gate stack G4 belongs to 2T silicon ONO silicon (2T SONOS) NVM cell. In the fifth embodiment shown in FIG. 18, the non-volatile gate stack G5 belongs to 1.5T SONOS NVM cell, also called embedded charge trap (eCT) memory cell. All these embodiments and the aforementioned embodiments have the common characteristic that the various NVM cells are disposed in the recess 104 of the substrate 102 while the logic gate stacks G2 are disposed on the top surface 102a of the substrate 102, and the top surface of the logic gate stacks G2 is higher than the top surface of the non-volatile gate stacks G1, G3, G4, G5 by a step height.

To summarize, the disclosure of the present invention provides a semiconductor device with a NVM cell positioned in a recess of the substrate and a logic transistor disposed on the top surface of the substrate, wherein the top surface of the logic gate stack is higher than the top surface of the non-volatile gate stack of the NVM cell by a step height. In addition, the logic transistor is fabricated after the formation of the non-volatile gate stack is complete, which means a NVM-first process is provided based on the spirit of the present invention. Accordingly, the logic gate stack is made of a material layer different from any of the floating gate, the control gate, and the selecting gate of the NVM cell. Since the NVM cell is disposed in the recess of the substrate and covered by a buffer layer during fabricating the logic transistor, the control gate of the NVM cell will not be damage in the following process for forming the metal gate or other fabrication process of the logic transistor, such as gate CMP process in HKMG scheme and ILD layer CMP process. In addition, the NVM-first process prevents the logic transistor from impact caused by complicated processes (such as multiple thermal processes) of the NVM cell. Furthermore, by forming the recess of the substrate, dual silicon surfaces are provided and the NVM cell is fabricated on the basement surface. No extra critical process or condition is introduced, and the disclosed method could be easily embedded in a traditional manufacture process of the logic transistor, such as HKMG scheme and polysilicon gate transistor scheme. Accordingly, the performance and yield of the semiconductor device can be effectively raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate with a memory region and a logic region, the substrate having a recess disposed in the memory region;
a logic gate stack disposed in the logic region, wherein the logic gate stack has a first top surface;
a non-volatile gate stack disposed in the recess, wherein the non-volatile gate stack has a second top surface and the second top surface is lower than the first top surface by a step height; and
an inter-layer dielectric (ILD) layer disposed on the substrate to cover the second top surface of the non-volatile gate stack, wherein the ILD layer has a third top surface coplanar with the first top surface and higher than the second top surface by the step height.

2. The semiconductor device according to claim 1, wherein the non-volatile gate stack includes an oxide-nitride-oxide (ONO) stack-layer between an upper polysilicon layer and a lower polysilicon layer.

3. The semiconductor device according to claim 2, further comprising at least two memory shallow trench isolation (STI) structures disposed in the recess.

4. The semiconductor device according to claim 3, wherein the non-volatile gate stack includes a floating gate composed of the lower polysilicon layer, and the floating gate is disposed between the two memory STI structures.

5. The semiconductor device according to claim 1, further comprising at least one logic STI structure disposed in the logic region, wherein a top surface of the logic STI structure is higher than a top surface of the memory STI structures.

6. The semiconductor device according to claim 1, further comprising:
   a buffer layer covering a sidewall of the non-volatile gate stack but not disposed in the logic region; and
   a spacer covering the surface of the buffer layer in the memory region and a sidewall of the logic gate stack in the logic region.

7. The semiconductor device according to claim 6, wherein the buffer layer comprises oxide.

8. The semiconductor device according to claim 1, wherein the logic gate stack comprises metal material.

9. The semiconductor device according to claim 1, wherein a depth of the recess is about 500 to about 2500 angstroms.

10. The semiconductor device according to claim 1, wherein the step height is about 200 to about 800 angstroms.

11. The semiconductor device according to claim 1, wherein the non-volatile gate stack belongs to a non-volatile memory (NVM) cell, and the NVM cell is an electron tunnel oxide (ETOX) NVM cell or a silicon ONO silicon (SONOS) NVM cell.

* * * * *